(12) United States Patent
Mourant et al.

(10) Patent No.: US 6,396,362 B1
(45) Date of Patent: May 28, 2002

(54) COMPACT MULTILAYER BALUN FOR RF INTEGRATED CIRCUITS

(75) Inventors: Jean-Marc Mourant, Groton; James Imbornone, Methuen, both of MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/480,032

(22) Filed: Jan. 10, 2000

(51) Int. Cl.[7] ................................................ H03H 7/42
(52) U.S. Cl. .......................... 333/25; 336/200; 333/26
(58) Field of Search ...................... 333/26, 25; 336/200; 437/60

(56) References Cited

U.S. PATENT DOCUMENTS

| | | | |
|---|---|---|---|
| 3,976,959 A | 8/1976 | Gaspari | 333/26 |
| 4,193,048 A | 3/1980 | Nyhus | 333/26 |
| 4,260,963 A | 4/1981 | Drapac | 333/26 |
| 4,999,597 A * | 3/1991 | Gaynor | 333/246 |
| 5,025,232 A | 6/1991 | Pavio | 333/26 |
| 5,304,959 A | 4/1994 | Wisherd et al. | 333/26 |
| 5,451,914 A * | 9/1995 | Stengel | 333/25 |
| 5,455,545 A | 10/1995 | Garcia | 333/26 |
| 5,497,137 A | 3/1996 | Fujiki | 336/200 |
| 5,523,728 A | 6/1996 | McCorkle | 333/128 |
| 5,644,272 A | 7/1997 | Dabrowski | 333/26 |
| 5,793,272 A * | 8/1998 | Burghartz et al. | 336/200 |
| 5,852,866 A * | 12/1998 | Kuettner et al. | 29/608 |
| 5,949,299 A * | 9/1999 | Harada | 333/25 |
| 6,097,273 A * | 8/2000 | Frye et al. | 336/200 |
| 6,198,374 B1 * | 3/2001 | Abel | 336/200 |

OTHER PUBLICATIONS

"Multilevel–Spiral Inductors Using VLSI Interconnect Technology", Joachim N. Burghartz, IEEE Electron Device Letters, vol. 17, No. 9, Sep. 1996, p. 428–430.

* cited by examiner

Primary Examiner—Robert Pascal
Assistant Examiner—Dean Takaoka
(74) Attorney, Agent, or Firm—Ratner & Prestia; Joseph P. Abate

(57) ABSTRACT

A compact BALUN transformer comprises a primary and a secondary conductor loop. Each of these loops are disposed in a substantially flat spiral configuration. However, one of these loops, either the primary or the secondary, is preferably disposed in a multi-layer (stacked) configuration. The stacking of at least one of the primary or secondary layers in a multi-layer arrangement provides an increase of impedance in one of the loops. This increased impedance for impedance matching purposes comes with the advantage that parasitic capacitance between primary and secondary layers as would normally be introduced in a multi-layer configuration is absent. In another embodiment of the present invention, both conductor loops are disposed in a multi-layer configuration. Such configurations are particularly useful for 1 to 1 impedance matching conditions and for somewhat lower frequency BALUN circuits.

3 Claims, 5 Drawing Sheets

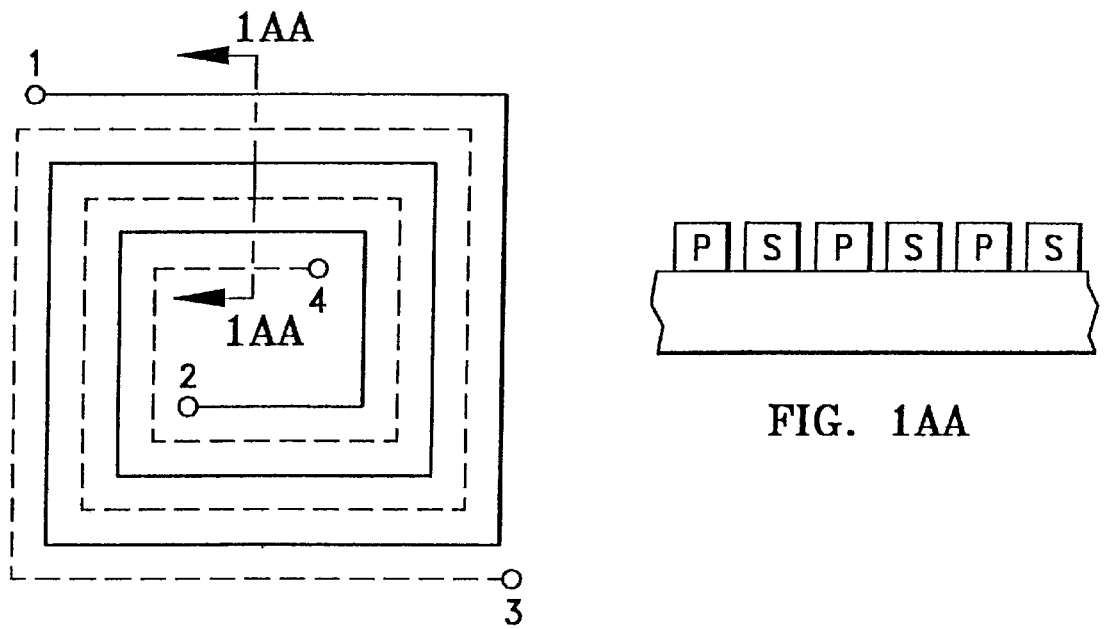
FIG. 1AA
FIG. 1A
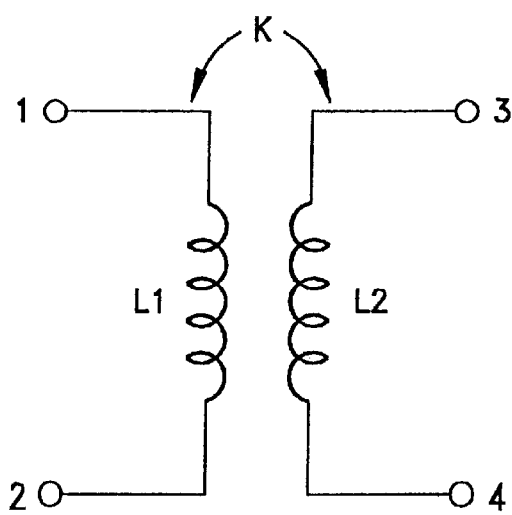
FIG. 1B

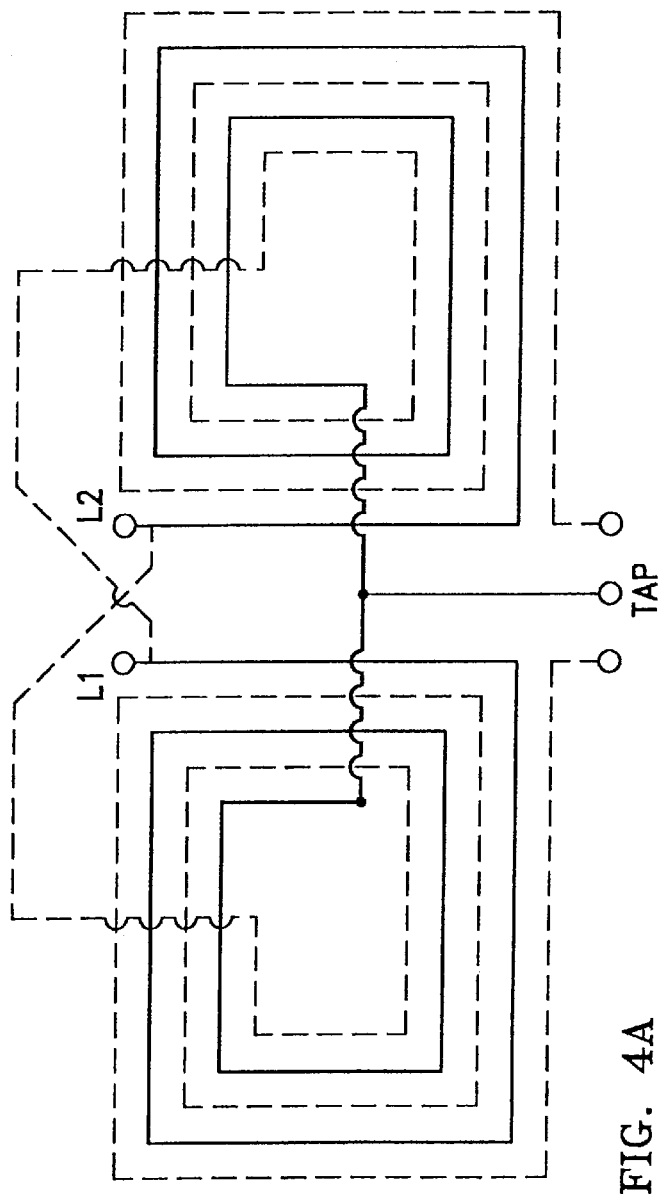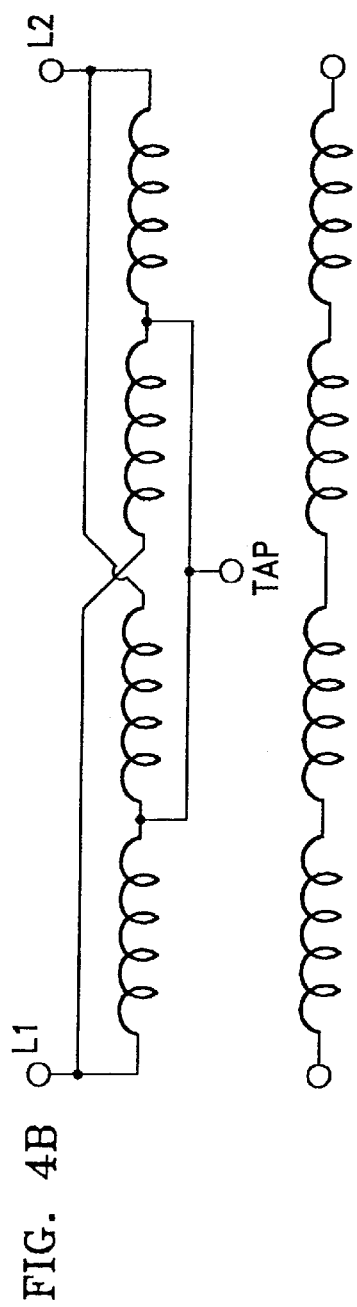
FIG. 4A
FIG. 4B

COMPACT MULTILAYER BALUN FOR RF INTEGRATED CIRCUITS

BACKGROUND OF THE INVENTION

The present invention is generally directed to BALUN transformer circuits for analog signals. More particularly, the present invention is directed to the construction of BALUN circuits which are fabricated on the integrated circuit substrate. Even more particularly, the present invention is directed to BALUN transformer structures which are disposed in a plurality of layers so as to make the BALUN structures which are not only compact but which also reduce parasitic capacitance effects between primary and secondary transformer circuits.

A BALUN is an electronic circuit component which is employed to provide impedance balance in radio frequency (RF) circuits. In essence, the BALUN is a balanced to un-balanced transformer. These devices are used in radio frequency applications to connect un-balanced components and circuits to balanced ones.

Unbalanced circuit components are usually large and expensive and include such devices as filters and power amplifiers. To make them balanced, while possible, would require them to be twice as large and expensive. On the other hand, balanced components are usually found in integrated circuits because the cost of doubling the number of internal components is low in an integrated circuit structure. BALUN circuits also have desirable electrical properties. They have improved signal isolation and linearity characteristics and, accordingly, are used whenever possible. In an un-balanced circuit, the current is typically carried by a single wire and returned through a ground which is preferably a large conductor which either forms the chassis for the device or is otherwise electrically connected directly to the chassis. On the other hand, a balanced circuit typically includes two conductors and a ground. In the BALUN case, current flows "down" one conductor and returns via the other one. This eliminates current flowing through the ground. This is the ideal situation.

BALUN circuits are desired in radio design because chip designs tend to be differential while external components tend to be single ended. Hence, a BALUN transformer is needed to couple internal and external components. However, BALUN's generally have limitations with respect to cost and size particularly when it comes to their use in radio frequency devices such as cellular telephones. These devices clearly require BALUNS that exhibit small sizes particularly with respect to the other components in a cellular telephone or cellular telephone system. Hence, there is a need for small inexpensive BALUN transformers that also exhibit good electrical performance. In particular, it is highly desirable that integrated radio frequency integrated circuits employ differential circuits which tend to improve isolation to common mode signals. Furthermore, power matching requires the use of balanced impedance transformers. Additionally, passive as opposed to active BALUN devices are desirable because they do not require additional current for their operation. However, passive baluns tend to be physically very large. The present BALUN invention allows for size reduction in passive BALUN devices.

SUMMARY OF THE INVENTION

In accordance with a preferred embodiment of the present invention, a radio frequency BALUN transformer comprises a substantially flat primary conductive loop and a substantially flat secondary conductive loop. These conductive loops are each configured in spiral patterns. The loops are disposed so that at least a portion of one of the loops is positioned so as to be horizontally adjacent to a portion of the other loop. Additionally, at least one of the loops is disposed in at least two vertically adjacent planes. The loop portions in vertically adjacent planes have the same winding orientation. In one particular embodiment of the present invention, both of the loops have portions which are disposed in vertically adjacent planes. The BALUN transformers of the present invention are particularly useful in high frequency applications; for example, a BALUN circuit useful at a frequency of approximately 850 megahertz can be constructed in a rectangular pattern which is only 235 microns on each side.

Accordingly, it is an object of the present invention to provide compact BALUN transformer circuits.

It is also another object of the present invention to provide impedance matching in high frequency circuit applications without the utilization of active circuit components.

It is yet another object of the present invention to reduce the parasitic capacitance that exists between the primary and secondary windings of a BALUN transformer.

It is a still further object of the present invention to provide BALUN transformer circuits which are particularly useful in cellular telephones and cellular telephone systems.

It is also an object of the present invention to provide BALUN transformer circuits which may be fabricated using integrated circuit fabrication procedures.

It is also an object of the present invention to provide a BALUN circuit which may be fabricated in two or more planar circuit structures.

It is yet another object of the present invention to provide a BALUN circuit which is small, effective, easy to manufacture and which is of low cost.

Lastly, but not limited hereto, it is an object of the present invention to provide BALUN circuits having a variety of impedance characteristics.

The recitation herein of a list of desirable objects which are met by various embodiments of the present invention is not meant to imply or suggest that any or all of these objects are present as essential or necessary features, either individually or collectively, in the most general embodiment of the present invention or in any of its more specific embodiments.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1A is a physical circuit diagram of a planar BALUN transformer which does not exhibit the advantages of the present invention;

FIG. 1AA is a side schematic view taken in the directions of the arrows 1AA of FIG. 1A;

FIG. 1B is a lumped equivalent circuit schematic diagram of the circuit shown in FIG. 1A;

FIG. 2AA is a side schematic view taken in the directions of the arrows 2AA and through the multi-layers of FIG. 2A;

FIG. 4A is a physical circuit layout for a BALUN which also provides a 4 to 1 impedance matching transformation;

FIG. 4B is a lumped equivalent circuit schematic diagram for the circuit shown in FIG. 4A;

DETAILED DESCRIPTION OF THE INVENTION

For a better understanding of the circuits illustrated in the present application, it is indicated that primary windings are generally denoted by solid lines. Similarly secondary windings are denoted by dotted lines. This is for convenience and it should also be understood that the designations of "primary" and "secondary" are relative terms.

FIGS. 1A and 1AA illustrate a planar BALUN with a primary winding with terminals 1 and 2. Similarly, secondary winding has terminals 3 and 4. The windings are disposed substantially in a single plane and are disposed adjacent to one another, as shown.

FIG. 1B is an equivalent circuit for the BALUN transformer shown in FIG. 1A. In particular, it is seen that the primary circuit has inductance L1 and the secondary circuit has inductance L2. There is also defined a coefficient of coupling k between the primary and secondary circuits. In particular, $k=M/(L1\times L2)^{1/2}$, where M is the mutual inductance between the primary and secondary windings. In circuits such as shown in FIGS. 1A and 1B, there is in fact an impedance transformation which takes place in which the input impedance $Z_{in}$ looking into terminals 1 and 2 of the transformer is equal to $Z_{load}\times(L1/L2)$ where $Z_{load}$ is the impedance of the load connected across output terminals 3 and 4.

Figure 2A:
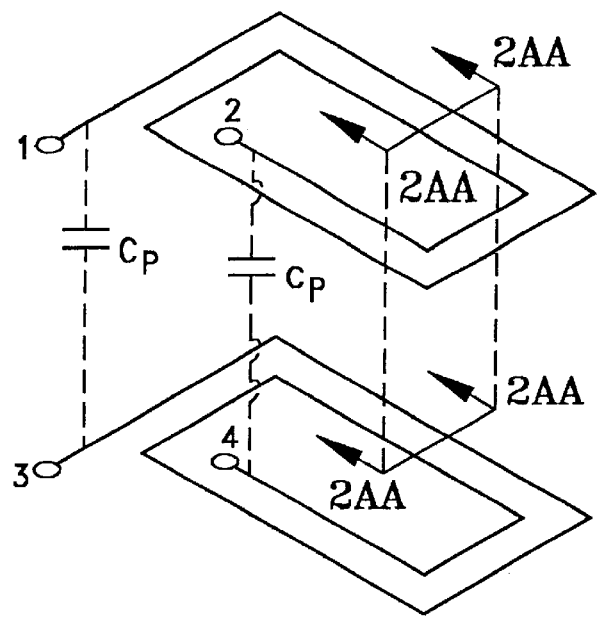
FIG. 2A is an isometric physical circuit diagram of a multi-layer BALUN circuit which also does not provide the advantages present in the present application.
Figure 2A:
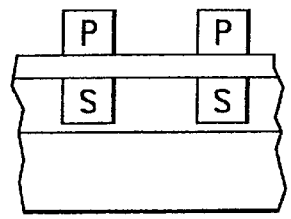

If one were to attempt to make the BALUN circuit shown in FIGS. 1A and 1B more compact by disposing the windings in a different configuration with an overlying planar structure, the physical circuit shown in FIGS. 2A and 2AA is the result. However, it is noted that because of the presence of an intermediate insulating layer (not shown) between the primary and secondary windings there is introduced a parasitic capacitance $C_p$ between the primary and secondary windings. This parasitic capacitance is illustrated by the addition of capacitors connected to the rest of the circuit via the dotted line conductors in FIG. 2A. However, it is noted that while the parasitic capacitance in FIG. 2A is illustrated by the presence of lumped circuit components, the relatively high parasitic capacitance introduced by this configuration is in fact distributed along the conductive paths and is present because of insulative material disposed between the layers and the broadside coupling that occurs between layers. In this regard, it is also to be specifically noted that FIG. 2A is indeed an isometric physical drawing illustrating a multi-layer BALUN circuit. In particular, the primary is present in an upper layer and the secondary winding is present in a lower or bottom layer. It is also noted that in FIG. 2A the secondary winding is not shown as a dotted line since such is not necessary for illustrative purposes employed elsewhere herein.

Figure 2B:
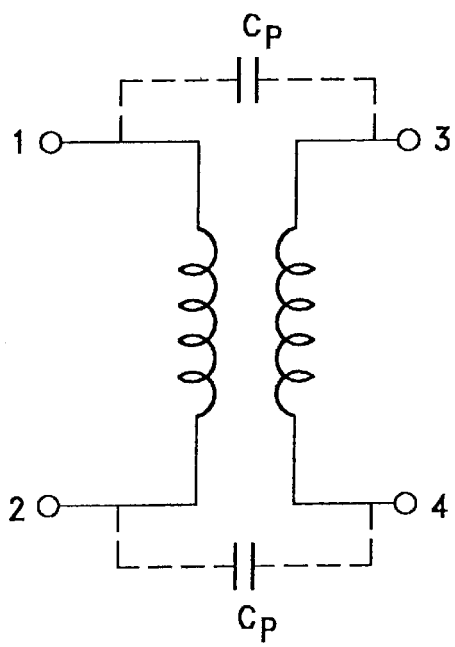
FIG. 2B is a lumped schematic circuit diagram illustrating an equivalent electrical structure to that shown in FIG. 2A.

FIG. 2B illustrates a lumped circuit equivalent schematic diagram for FIG. 2A. In particular, it is noted that the parasitic capacitance $C_p$ does provide a high frequency path between the primary and secondary windings. This does not provide a desirable level of isolation for common mode signals.

Figure 3:
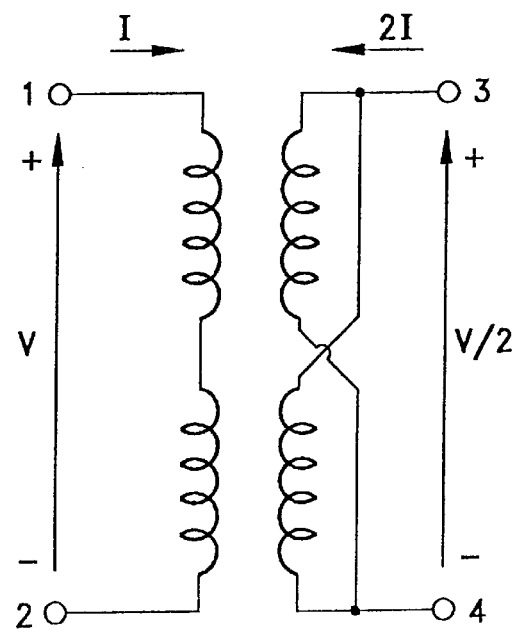
FIG. 3 is a schematic diagram illustrating the utilization of winding connections in a transformer to provide 4 to 1 impedance matching.

FIG. 3 illustrates a method for connecting transformer windings to achieve a 4 to 1 impedance matching transformer circuit. In particular, while the primary circuit is conventional, it is noted that the secondary windings are connected in a parallel configuration, as shown. As a consequence the voltage output for the secondary circuit is V/2 assuming that the voltage across terminals 1 and 2 is V. Likewise, the current through terminal 3 is 2I, assuming that the current in the primary circuit is I. If one defines the input impedance as $Z_1=V/I$, then it is clear that the output impedance $Z_2=V/4I=Z_1/4$.

One way of achieving this 4 to 1 impedance matching in a flat spirally disposed BALUN circuit is illustrated in FIG. 4A. This circuit is similar to that shown in FIG. 3 except that a center tap is provided and a larger number of windings is employed. A lumped equivalent circuit diagram for FIG. 4A is shown in FIG. 4B.

Figure 5:
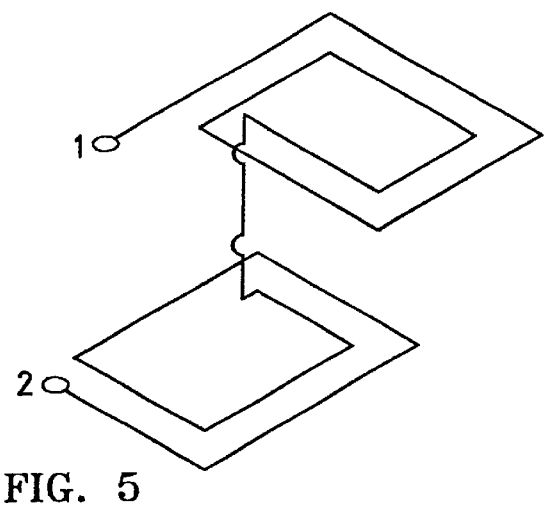
FIG. 5 is an isometric physical circuit diagram illustrating the employment of multi-layer or stacked inductors to provide inductance increases.

FIG. 5 illustrates the physical arrangement for a multiple layer stacked inductor circuit. This Figure is included for illustrative purposes. In particular, it is noted that it does not contain a primary circuit or a secondary circuit. It is, however, noted that it does describe a pair of substantially flat spirally configured conductive loops in which the loops are disposed in two adjacent planar structures. As with the other circuits illustrated herein in which planar circuits are illustrated, it is assumed that an insulative layer is disposed between the upper and lower planar structures. The presence and construction of such insulative layers is well understood to those of even meager skill in the printed circuit and integrated circuit arts. However, with particular reference to FIG. 5, it is noted that the upper and lower windings are each directed in the same winding direction so that a current which enters terminal 1 in the top layer flows in a clockwise direction and likewise, this same current, as it enters the lower layer, is also seen to flow in a clockwise direction. As a consequence of the vertically adjacent and horizontally adjacent structure shown in FIG. 5, the coupling between the upper and lower winding layers is such that the inductance increases as the square of the number of turns. In particular, a 2 turn inductor produces an inductance of 4 times the inductance of a single planar structure. Likewise, a 3 turn inductor produces an inductance increased by a factor of 9. This aspect of inductive coupling between layers in such circuits is used to advantage for impedance matching in a BALUN circuit.

Figure 6:
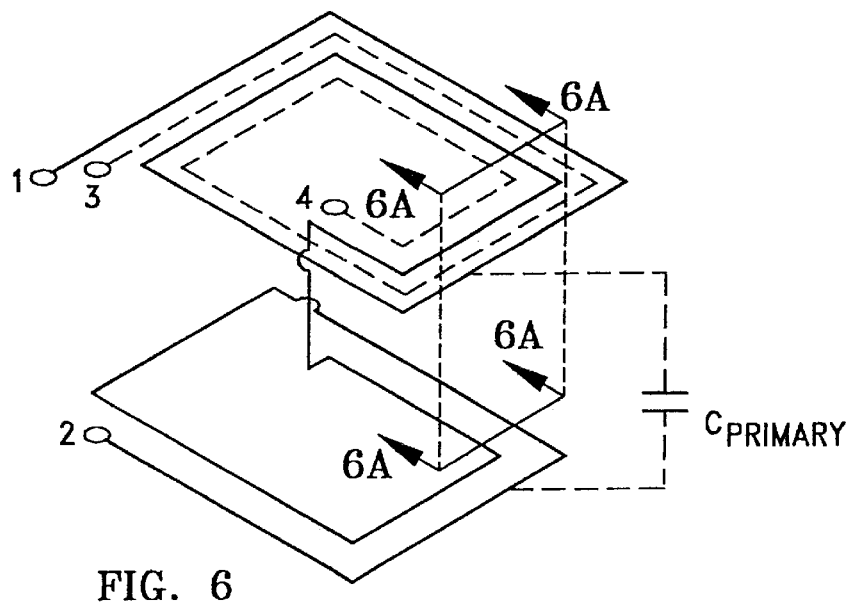
FIG. 6 is an isometric multi-layer physical BALUN circuit constructed in accordance with one embodiment of the present invention which particularly shows a primary circuit disposed in multiple layers.
Figure 6A:
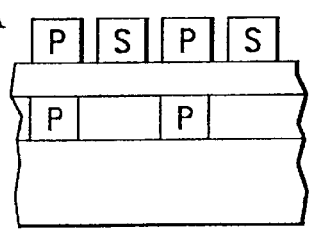
FIG. 6A is a side schematic view taken in the directions of the arrows 6A and through the multiple layers of FIG. 6.
Figure 7:
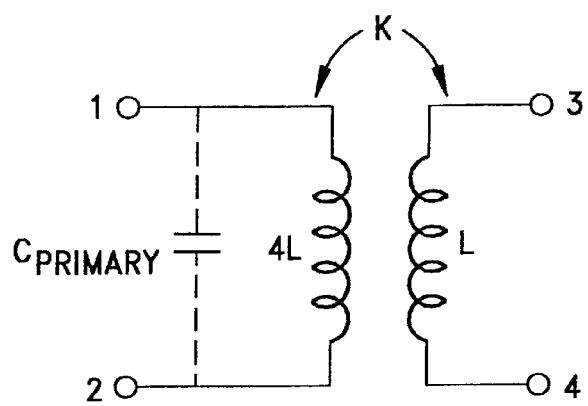
FIG. 7 is a lumped equivalent circuit diagram for the physical circuit shown in FIG. 6.

With particular reference to FIGS. 6 and 6A it is noted that such a multi-level structure is provided for a primary circuit for a BALUN transformer. At the same time, a secondary circuit is disposed in only a single plane. In the particular case illustrated in FIG. 6, the secondary BALUN transformer circuit is disposed in the upper level or layer. Also, of particular note in the present invention is that the primary parasitic capacitance that normally exists between layers in a multi-layer circuit now couples only the upper and lower primary circuits. The parasitic capacitance introduced between the primary and secondary circuit is minimized as a result of having provided a multi-layer structure. Thus, in the present invention the parasitic capacitance between layers is across the primary only and not between the primary and secondary. This between a layer parasitic capacitance is not critical and does not degrade common mode rejection from the primary to secondary circuits. This point is also particularly illustrated in the lumped circuit equivalent of FIG. 6 which is shown in FIG. 7.

Figure 8:
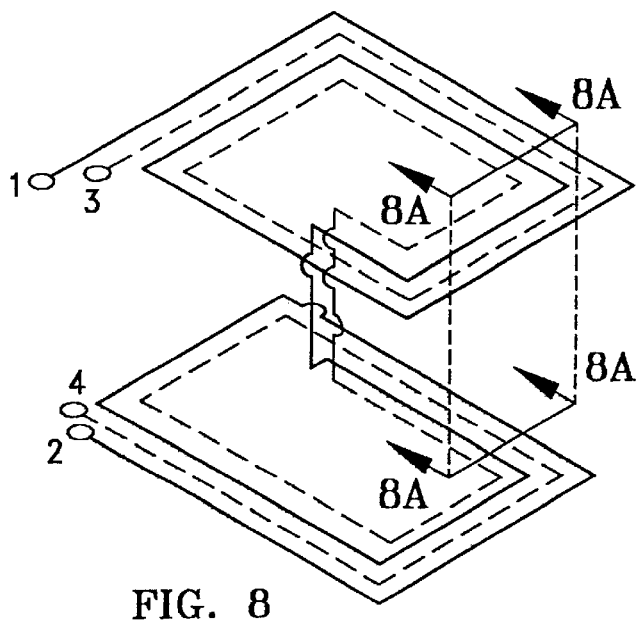
FIG. 8 is an isometric physical circuit diagram of a BALUN circuit in accordance with another embodiment of the present invention in which the secondary circuit also contains a portion divided into distinct planar stacks or layers.
Figure 8A:
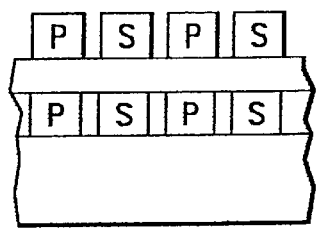
FIG. 8A is a side schematic view taken in the directions of the arrows 8A and through the layers of FIG. 8.
Figure 9:
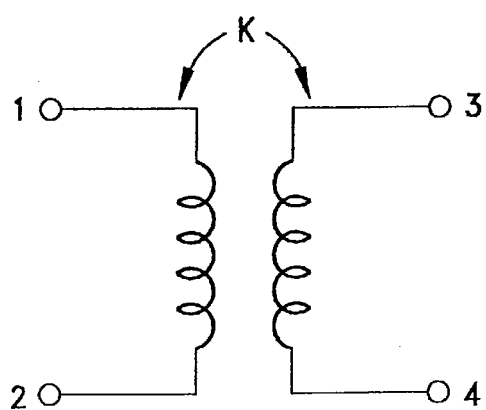
FIG. 9 is a lumped equivalent circuit schematic diagram for the physical circuit shown in FIG. 8.

Lastly, the physical circuit shown in FIGS. 8 and 8A and its corresponding schematic lumped circuit equivalent shown in FIG. 9 are considered. In this embodiment, the primary and secondary inductance is the same. That is, this is a one-to-one impedance transformer. The advantage in this particular circuit configuration is that a high inductance BALUN is realized in a small area and compact volume. Such BALUN's are more useful in lower frequency circuit applications.

If one employs conventional BALUN layout circuits for a 900 megahertz device, the size of the resulting circuit is approximately 800 by 400 microns. However, using the techniques and circuits of the present invention, a BALUN circuit designed for optimal operation at 850 megahertz comprises an area which is only approximately 235 microns by 235 microns. Both of these BALUN devices exhibit a 4 to 1 impedance matching profile. Accordingly, it is seen that the circuit of the present invention provides significant size advantages in the design and construction of compact multilayer BALUN circuits.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A balun transformer comprising:
a first loop conductor having a first portion wound in a flat spiral pattern in a first plane and a second portion wound in a flat spiral pattern with the same winding orientation as said first portion of said first loop conductor in a second plane parallel to said first plane; and
a second loop conductor wound in a flat spiral pattern in said first plane horizontally adjacent said first portion of said first loop conductor,
wherein at least one of said conductor loops is disposed in a rectangular pattern.

2. A balun transformer comprising:
a first loop conductor having a first portion wound in a flat spiral pattern in a first plane and a second portion wound in a flat spiral pattern with the same winding orientation as said first portion of said first loop conductor in a second plane parallel to said first plane; and
a second loop conductor wound in a flat spiral pattern in said first plane horizontally adjacent said first portion of said first loop conductor,
wherein said transformer is operative at a frequency of approximately 850 megahertz, provides a 4 to 1 impedance matching and is configured in a rectangular pattern which is approximately 235 microns on each side.

3. A balun transformer comprising:
a first loop conductor having a first portion wound in a flat spiral pattern in a first plane and a second portion wound in a flat spiral pattern with the same winding orientation as said first portion of said first loop conductor in a second plane parallel to said first plane; and
a second loop conductor having a first portion wound in a flat spiral pattern in said first plane horizontally adjacent said first portion of said first loop conductor and a second portion wound in a flat spiral pattern with the same winding orientation as said first portion of said second loop conductor in a second plane horizontally adjacent said second portion of said first loop conductor,
wherein said transformer is operative at a frequency of approximately 850 megahertz, provides a 1 to 1 impedance matching and is configured in a rectangular pattern which is approximately 235 microns on each side.

* * * * *